US009732427B2

United States Patent
Poxson et al.

(10) Patent No.: US 9,732,427 B2
(45) Date of Patent: Aug. 15, 2017

(54) TUNABLE NANOPOROUS FILMS ON POLYMER SUBSTRATES, AND METHOD FOR THEIR MANUFACTURE

(75) Inventors: David J. Poxson, Troy, NY (US); Frank W. Mont, Troy, NY (US); E. Fred Schubert, Troy, NY (US); Richard W. Siegel, Menands, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 4 days.

(21) Appl. No.: 13/817,922

(22) PCT Filed: Aug. 25, 2011

(86) PCT No.: PCT/US2011/049181
§ 371 (c)(1),
(2), (4) Date: Apr. 23, 2013

(87) PCT Pub. No.: WO2012/027587
PCT Pub. Date: Mar. 1, 2012

(65) Prior Publication Data
US 2013/0209780 A1 Aug. 15, 2013

Related U.S. Application Data

(60) Provisional application No. 61/402,174, filed on Aug. 25, 2010.

(51) Int. Cl.
*C23C 14/08* (2006.01)
*C23C 16/48* (2006.01)
(Continued)

(52) U.S. Cl.
CPC .......... *C23C 16/487* (2013.01); *C23C 14/083* (2013.01); *C23C 14/10* (2013.01);
(Continued)

(58) Field of Classification Search
CPC ..... C23C 14/10; C23C 14/225; C23C 14/226; G02B 2207/101; G02B 2207/107;
(Continued)

(56) References Cited

U.S. PATENT DOCUMENTS

2004/0247880 A1    12/2004  Valette et al.
2010/0028634 A1*   2/2010   Turevskaya ............. H01B 1/04
                                                            428/213
(Continued)

FOREIGN PATENT DOCUMENTS

WO    2009062140 A2    5/2009
WO    2010054357 A2    5/2010

OTHER PUBLICATIONS

Wu, Z.; Walish, J.; Nolte, A.; Zhai, L.; Cohen, R.; Rubner, M.; "Deformable Antireflection Coatings from Polymer and Nanoparticle Multilayers", Advanced Materials, 2006, 18, p. 2699-2702.*

(Continued)

*Primary Examiner* — Mark Ruthkosky
*Assistant Examiner* — Julia L Rummel
(74) *Attorney, Agent, or Firm* — Heslin Rothenberg Farley & Mesiti P.C.

(57) ABSTRACT

The invention is directed to a composite polymer/nanoporous film system and methods of fabrication of tunable nanoporous coatings on flexible polymer substrates. The porosity of the nanoporous film can be tuned during fabrication to a desired value by adjusting the deposition conditions. Experiments show that $SiO_2$ coatings with tunable porosity fabricated by oblique-angle electron beam deposition can be deposited on polymer substrates. These conformable coatings have many applications, including in the (Continued)

field of optics where the ability to fabricate tunable refractive index coatings on a variety of materials and shapes is of great importance.

10 Claims, 10 Drawing Sheets

(51) Int. Cl.
| | |
|---|---|
| *C23C 14/10* | (2006.01) |
| *C23C 14/22* | (2006.01) |
| *C23C 14/32* | (2006.01) |
| *C23C 14/34* | (2006.01) |
| *C23C 16/44* | (2006.01) |
| *C23C 16/50* | (2006.01) |
| *B82Y 20/00* | (2011.01) |
| *B82Y 30/00* | (2011.01) |

(52) U.S. Cl.
CPC .......... *C23C 14/226* (2013.01); *C23C 14/325* (2013.01); *C23C 14/34* (2013.01); *C23C 16/44* (2013.01); *C23C 16/50* (2013.01); *B82Y 20/00* (2013.01); *B82Y 30/00* (2013.01); *Y02T 50/67* (2013.01); *Y10T 428/24997* (2015.04); *Y10T 428/249967* (2015.04); *Y10T 428/249969* (2015.04); *Y10T 428/249978* (2015.04)

(58) Field of Classification Search
CPC .................... B82Y 20/00; B82Y 30/00; Y10T 428/249978; Y10T 428/249967
See application file for complete search history.

(56) References Cited

U.S. PATENT DOCUMENTS

| | | | |
|---|---|---|---|
| 2010/0109201 A1 | 5/2010 | Fletcher et al. | |
| 2011/0192233 A1* | 8/2011 | Aizenberg | ............ B29C 39/026 73/861 |
| 2011/0217544 A1* | 9/2011 | Young | ................. B29C 37/0032 428/327 |

OTHER PUBLICATIONS

Pei, S.; Du, J.; Zeng, Y.; Liu, Ch.; Cheng, H.; "The fabrication of a carbon nanotube transparent conductive film by electrophoretic deposition and hot-pressing transfer", Nanotechnology. 2009, 20, p. 1-7.*

Liu, Q.; Ren, W.; Chen, Z.; Wang, D.; Liu, B.; Yu, B. Li, F. Cong, H.; Chen. H.; "Diameter-Selective Growth of Single-Walled Carbon Nanotubes with High Quality by Floating Catalyst Method", ACS Nano, 2008, 2, 1722-1728.*

Lu, Y; Li, J.; Hong, H; "Electrical Resistivity of Pristine and Functional Single-Wall Carbon Nanotubes", Journal of Nanomaterials, 2013, p. 1-5.* de los Arcos, T.; Oelhafen, P.; Mathys, D; "Optical Characterization of Alignment and Effective Refractive Index in Carbon Nanotube Films" Nanotechnology, 2007, vol. 18, p. 1-5.*

McClure, D.J.; "Polyester (PET) Film as a Substrate: a Tutorial", Society of Vacuum Coaters 50th Annual Technical Conference Proceedings, 2007, p. 692-699.*

International Search Report dated Jan. 31, 2012 for PCT/US2011/049181.

* cited by examiner (a)

| Modeled DBR Structure | | | |
|---|---|---|---|
| Layer | Material | $n$ @ (550nm) | Thickness (nm) |
| 4 | 65% Nanoporous TiO$_2$ | 1.54 | 98 nm |
| 3 | 80% Nanoporous SiO$_2$ | 1.09 | 129 nm |
| 2 | 65% Nanoporous TiO$_2$ | 1.54 | 98 nm |
| 1 | 80% Nanoporous SiO$_2$ | 1.09 | 129 nm |
| Intermix | 50% Polycarbonate / 50% Nanoporous SiO$_2$ (80%) | 1.34 | 22 nm |
| Substrate | Polycarbonate film | 1.59 | 0.01" |

(b)

| Modeled ARC Structure | | | |
|---|---|---|---|
| Layer | Material | $n$ @ (550nm) | Thickness |
| 2 | 80% Nanoporous SiO$_2$ | 1.09 | 240 nm |
| 1 | SiO$_2$ | 1.46 | 52 nm |
| Intermix | 50% Polycarbonate / 50% Nanoporous SiO$_2$ (80%) | 1.34 | 50 |
| Substrate | Polycarbonate film | 1.59 | 0.01" |

TUNABLE NANOPOROUS FILMS ON POLYMER SUBSTRATES, AND METHOD FOR THEIR MANUFACTURE

CROSS REFERENCE TO RELATED APPLICATION

This application is the National Phase filing of International Application No. PCT/US11/49181, filed Aug. 25, 2011, which claims priority to U.S. provisional patent application Ser. No. 61/402,174, filed Aug. 25, 2010. The entire content of each prior application is hereby incorporated by reference.

STATE AND FEDERAL FUNDED RESEARCH

The invention described herein was made with support of the NYSTAR under Contract Number C090119. The U.S. Government may have certain rights to this invention.

TECHNICAL FIELD

The present invention relates generally to nanoporous films and polymer substrates, and related components, systems and methods. In one aspect, the present invention relates to nanoporous coatings on flexible or moldable polymer substrates.

BACKGROUND OF THE INVENTION

A variety of coating compositions have been reported for several decades. More recently, however, advances in fabrication and characterization methods of nanostructured films have helped spark renewed interest of these films for use in a wide range of applications. The drive for ever smaller feature sizes in coatings and substrates has been brought about through a desire to achieve attractive properties for applications in, for example, micro-electronics, anti-reflective coatings for displays and super-hydrophobic, and even self-cleaning surfaces.

The electronics industry utilizes such materials as insulating layers between circuits and components of integrated circuits and associated electronic devices with the aim of increasing speed and storage capability of microelectronic devices (e.g., computer chips). On the other hand antireflection coatings are generally disposed on an outermost surface of an image display device such as polarizing film for a liquid crystal display (LCD), the front plate of a touch panel (PET substrate), the front plate of a projection television (PC substrate), the front plate of a cathode ray tube display or plasma display panel (glass substrate), or an optical lens, to reduce reflectance and prevent optical interference or image glare caused by external light and enhance the visibility of image.

A number of fabrication methods are described. U.S. Pat. No. 5,895,263 describes forming a nanoporous silica dielectric film on a substrate, e.g., a wafer, by applying a composition comprising decomposable polymer and organic polysilica, i.e., including condensed or polymerized silicon polymer, heating the composition to further condense the polysilica, and decomposing the decomposable polymer to form a porous dielectric layer. This process, like many of the previously employed methods of forming nanoporous films on semiconductors, has the disadvantage of requiring heating for both the aging or condensing process, and for the removal of a polymer to form the nanoporous film. Furthermore, there is a disadvantage that organic polysilica tends to increase in molecular weight after the solution is prepared; consequently, the viscosity of such precursor solutions increases during storage, and the thickness of films made from stored solutions will increase as the age of the solution increases. The instability of organic polysilica thus requires short shelf life, cold storage, and fine tuning of the coating parameters to achieve consistent film properties in a microelectronics/integrated circuit manufacturing process.

There is a present need and current demand for new and improved coatings and compatible substrates that can be applied to a variety of applications, including the examples recited above of electronic devices and antireflection applications This is coupled with a continuing desire to reduce the cost in time, money and manufacturing equipment of producing such polymer composites and devices coated therewith. There remains this ongoing need for further improvements in both the desirable properties of nanoporous coatings, as well as an ongoing need for further improvements in methods for producing such coatings and complementary substrates.

SUMMARY OF THE INVENTION

The adhesion of the nanoporous $SiO_2$ to the polymer substrate allows for deposition on flexible and or moldable substrates while maintaining the optical and mechanical characteristics of the nanoporous film coating. These conformable coatings have many applications in the field of optics where the ability to fabricate tunable porosity coatings on a variety of materials and shapes is of great importance. The process can be extended to multi-layer films as well as a wide variety of deposited materials for additional applications.

One aspect of the present invention is directed to a composite polymer-nanoporous film, comprising: a nanoporous coating; and a flexible polymer substrate, wherein said nanoporous coating is on the surface of said polymer substrate and wherein said nanoporous coating is tunable on said polymer substrate. In one embodiment, the nanoporous coating on the surface of the polymer substrate is from about 10 nm to about 10000 nm thick. In another embodiment, the nanoporous coating on the surface of the polymer substrate is from about 10 nm to about 2000 nm thick. In one embodiment, the nanoporous coating on the surface of the polymer substrate is from about 100 nm to about 1000 nm thick. In one embodiment, the nanoporous coating on the surface of the polymer substrate is about 300 nm to about 600 nm thick. In another embodiment, the nanoporous coating on the surface of the polymer substrate is about 500 nm thick. In one embodiment, the nanoporous coating on the surface of the polymer substrate is about 1700 nm to about 2300 nm thick. In another embodiment, the nanoporous coating on the surface of the polymer substrate is about 2000 nm thick.

In one embodiment, the porosity of the nanoporous coating is from about 1% to about 95%. In another embodiment, the porosity of the nanoporous coating is from about 40% to about 90%. In another embodiment, the porosity of the nanoporous coating is from about 50% to about 99%. In one embodiment, the nanoporous coating has tunable structure and properties on the polymer substrate. In one embodiment, the nanoporous coating is a tunable refractive index film.

In one embodiment, the nanoporous coating is firmly adhered to the flexible or moldable polymer substrate, and upon repeated bending of the composite polymer-nanoporous film, the composite polymer-nanoporous film retains its structural and physical characteristics.

In one embodiment, the composite polymer-nanoporous film is molded into one or more 3 dimensional shapes, and said nanoporous coating retains its structural integrity and maintains its physical properties after molding. In one embodiment, the composite polymer-nanoporous film is stretched or shrunk in one or more dimensions, and said nanoporous coating retains its structural integrity and maintains its physical properties.

In one embodiment, the nanoporous coating is a tunable refractive index film and can be deposited on said flexible or moldable polymer substrate. In another embodiment, the composite polymer-nanoporous film has a plurality of uniformly or randomly distributed nanopores. In one embodiment, the nanoporous coating comprises organic particles such as carbon nano-tubes or nano-spheres. In another embodiment, the nanoporous coating comprises inorganic particles. In another embodiment, the nanoporous coating comprises one or more metals, non-metals, or combinations thereof.

In one embodiment, the nanoporous coating is selected from the group consisting of CdS, CdSe, PbSe, CdTe, PbS, PbSe, PbTe, ZnS, ZnSe, $Bi_2S_3$, $Bi_2Se_3$, $Bi_2Te_3$, HgS, HgSe, HgTe, InP, InAs, and core/shell CdSe/ZnS, Si, Ge, GaAs, InGaAs, InP, SiGe, CdSe/CdS, InP/CdSe, InP/ZnS, InP/ZnSe, InAs/CdSe, InAs/ZnSe, and combinations thereof. In another embodiment, the nanoporous coating is selected from the group consisting of metals such as Cu, Fe, Ti, Co, Mn, Zn, Au, Ag, Cr, Pd, Pt, Al, and alloys and combinations thereof. In yet another embodiment, the nanoporous coating comprises at least one compound selected from a group consisting of aluminum oxide, silicon oxide, zirconium oxide, titanium oxide, antimony oxide, zinc oxide, tin oxide, indium oxide, cerium oxide, and combinations thereof. In one embodiment, the nanoporous coating comprises silicon dioxide, titanium dioxide, or a combination thereof.

In one embodiment, the polymer substrate comprises at least one compound selected from the group consisting of polycarbonate, polycarbonate film (LEXAN®), polyester, polyester film (polyethylene terephthalate, PET), polyimide, polyolefin, polyolefin film (shrink wrap), polyethylene oxide (PEO), poly(methyl methacrylate) PMMA, nylon, silicone, rubber, synthetic rubber, vinyl, polystyrene, biopolymer, conductive polymer, and combinations thereof. In another embodiment, the nanoporous coating comprises nanoparticles of about 100 nm or less in their smallest dimension. One aspect of the present invention is directed to the use of the composite polymer-nanoporous film as is taught herein in optics, photovoltaics, power sources or storage devices, catalysts, actuators and sensors.

One aspect of the present invention is directed to a method of making a tunable nanoporous film on a flexible or moldable polymer substrate, said method comprising: preparing a flexible or moldable polymer substrate; preparing a nanoporous coating; and depositing said nanoporous coating on said flexible or moldable polymer substrate, under conditions effective to form one or more layers of said nanoporous coating on said polymer substrate. In one embodiment, the flexible or moldable polymer substrate is loaded into a high vacuum, electron beam deposition chamber. In another embodiment, preparing the nanoporous coating comprises preparing a composition comprising nanoparticles of about 100 nm or less in their smallest dimension.

In one embodiment, the depositing step includes oblique-angle electron beam deposition, spin coating, dip coating, spray coating, flow coating, meniscus coating, capillary coating, or roll coating or combinations thereof. In one embodiment, the nanoporous coating is deposited on the substrate by a technique selected from the group consisting of oblique-angle electron beam deposition, filament evaporation, flash evaporation, physical evaporation, plasma vapor deposition, pulsed laser deposition, cathodic arc deposition, sputtering, chemical vapor deposition (CVD), and combinations thereof. In another embodiment, the nanoporous coating is deposited on the substrate by oblique-angle electron beam deposition. In another embodiment, the end product has a reflectivity of less than 10% and a transmittance of more than 90%. That is, the composite polymer-nanoporous film has a reflectivity of less than 10% and a transmittance of more than 90%. This refers to optical reflectivity and transmittance.

In one embodiment, the depositing of the nanoporous coating on said flexible or moldable polymer substrate by oblique-angle electron beam deposition determines the porosity of the coating, and if the deposition angle is about 45 degrees, the porosity of the nanoparticle coating is from about 2% to about 25%. In another embodiment, the depositing of the nanoporous coating on said flexible or moldable polymer substrate by oblique-angle electron beam deposition determines the porosity of the coating, and if the deposition angle is about 85 degrees, the porosity of the nanoporous coating is from about 60% to about 90%. In one embodiment, the tunable nanoporous film on a flexible or moldable polymer substrate is used in optics, photovoltaics, power sources or storage devices, catalysts, actuators and sensors.

One aspect of the present invention is directed to a method for applying a nanoporous coating to a polymer substrate comprising: preparing said substrate; preparing a nanoporous coating composition comprising titanium dioxide, silicon dioxide, or a mixture thereof; and depositing said nanoporous coating on said substrate, under conditions effective to form one or more layers of said nanoporous coating on said substrate.

In one embodiment, the flexible or moldable polymer substrate is loaded into a high vacuum, electron beam deposition chamber. In another embodiment, the preparing the nanoporous coating comprises preparing a composition comprising nanoparticles of about 100 nm or less in their smallest dimension. In one embodiment, the nanoporous coating has antireflective properties, including a reflectivity of less than 10% and a transmittance of more than 90%. In one embodiment, the tunable nanoporous film on a flexible or moldable polymer substrate is used in optics, photovoltaics, power sources or storage devices, catalysts, actuators and sensors.

One aspect of the present invention is directed to a method for fabricating a tunable nanoporous film on a flexible or moldable polymer substrate, said method comprising: preparing a nanoporous coating composition comprising nanoparticles of about 100 nm or less in their smallest dimension; loading a flexible or moldable polymer substrate into a high vacuum, electron beam deposition chamber; and depositing said nanoporous coating composition on said polymer substrate, such that one or more layers of said nanoporous coating form on said polymer substrate. In one embodiment, the nanoporous coating is deposited on the substrate by oblique-angle electron beam deposition. In another embodiment, the nanoporous coating composition is applied to the substrate such that it forms a coating of 10 nm to 2000 nm on the surface of said substrate. In a related embodiment, the thickness of the coating is from 10 nm to 10000 nm.

In one another embodiment, the nanoporous coating is firmly adhered to the flexible or moldable polymer substrate, and wherein upon bending or molding the polymer substrate with the coating into one or more 3 dimensional shapes, the composite polymer-nanoporous film retains its structural integrity and maintains its physical properties. In yet another embodiment, the composite polymer-nanoporous film is stretched or shrunk in one or more dimensions, and wherein said nanoporous coating retains its structural integrity and maintains its physical properties.

In one embodiment of the present invention, the nanoparticles themselves are porous. That is, the nanoporous coating comprises nanoporous particles. Such nanoporous particles are then applied as a coating on the flexible or moldable polymer substrate. In one embodiment, the composite polymer-nanoporous film of the present invention includes a nanoporous coating comprising nanoporous particles of about 100 nm or less in their smallest dimension. In another embodiment, the nanoporous coating comprises nanoporous particles of about 200 nm or less in their smallest dimension. In another embodiment, the nanoporous coating comprises nanoporous particles of about 300 nm or less in their smallest dimension.

BRIEF DESCRIPTION OF THE FIGURES

FIG. 1(a) shows nanoporous films are deposited by oblique-angle electron beam deposition. Porosity of deposited film was controlled by vapor flux incident angle. FIG. 1(b) shows initial deposition of randomly distributed islands of height variation. FIG. 1(c) shows islands of height variation create shadowed regions that give rise to nano-columnar growth in the approximate direction of the incident vapor flux.

FIG. 3 (a) shows SEM image of a 200 nm thick, 65% nanoporous $SiO_2$ film deposited on polyimide polymer tape with a glass backing substrate. FIG. 3 (b) shows that the nanoporous $SiO_2$ film structure is clearly visible, and FIG. 3 (c) shows the nanoporous $SiO_2$ film before and after peel-off and reattachment to glass backing substrate.

FIG. 6 (c, d) show calculated and measured reflectance values of nanoporous film distributed Bragg reflector (DBR) and anti-reflection (AR) coatings on polycarbonate substrates before and after bending about a radius of curvature of 5 mm, repeated 10 consecutive times.

FIG. 7 shows the calculated structure parameters for DBR (FIG. 7a) and AR (FIG. 7b) coatings.

DETAILED DESCRIPTION

Figure 1:
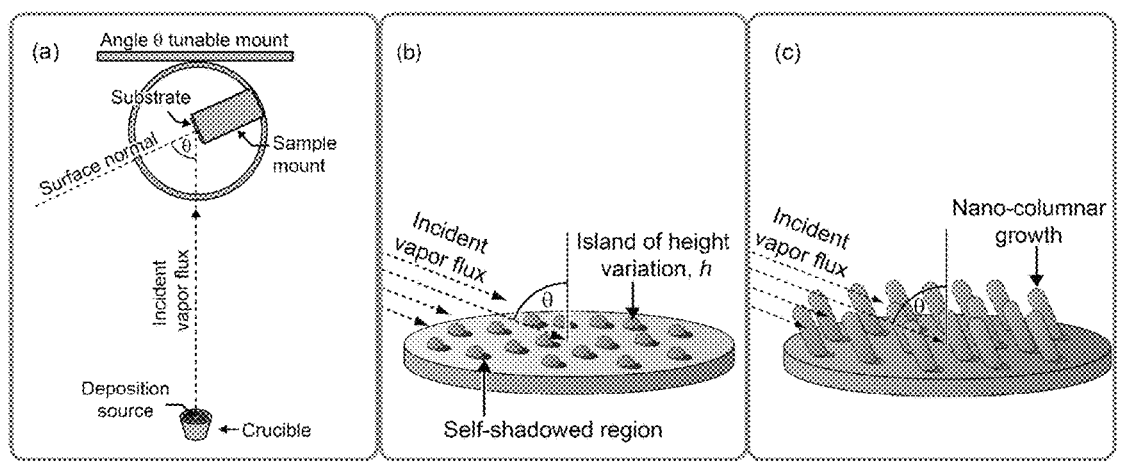
FIG. 1 shows a schematic example of the nanoporous films and their deposition.

In the framework of this invention, unless otherwise specified, the term "nanoparticles" is defined as particles of about 100 nm or less in their smallest dimension. Methods for determining the particle dimension include, but are not limited to, optical light scattering or scanning electron microscopy, or atomic force microscopy (AFM) imaging.

The term "nanoporous coating" or "nanoporous film" refer to organic or inorganic nanoparticles, metal or nonmetal nanoparticles, compound nanoparticles, or combinations thereof used as a coating or film and having pores or voids among the nanoparticles.

The present invention relates to a nanoporous coating or film and fabrication method thereof, and more particularly to a nanoporous coating with very high surface area and anti-reflectivity. The invention relates to a new process for the preparation of nano-porous coatings or films, and articles comprising said coatings. In particular, one aspect of the present invention relates to flexible or moldable polymer substrates having a nanoporous coating on the surface, new methods for preparing said polymer substrate coated composites, and related articles. In particular, the invention is directed to a composite polymer-nanoporous film, and method of fabrication of tunable nanoporous films on flexible or moldable polymer substrates. In one embodiment, the invention also relates to the use of said nanoporous coatings, in particular in optics, photovoltaics, power sources or storage devices, catalysts, actuators and sensor applications.

One aspect of the present invention is directed to a composite polymer-nanoporous film, comprising: a nanoporous coating; and a flexible or moldable polymer substrate, wherein said nanoporous coating is on the surface of said polymer substrate and wherein said nanoporous coating is tunable on said polymer substrate. The nanoporous coating on the surface of the polymer substrate is from about 10 nm to about 10000 nm thick. The nanoporous coating on the surface of the polymer substrate can be from about 10 nm to about 2000 nm thick, or alternatively from about 100 nm to about 1000 nm thick. In one embodiment, the nanoporous coating on the surface of the polymer substrate is about 300 nm to about 600 nm thick, or about 500 nm thick. In one embodiment, the nanoporous coating on the surface of the polymer substrate is about 1700 nm to about 2300 nm thick, or about 2000 nm thick.

The porosity of the nanoporous coating is controlled to achieve the desired porosity. For example, the porosity of the nanoporous coating can be from about 1% to about 95%, or from about 40% to about 90%. In one embodiment, the porosity of the nanoporous coating is from about 1% to about 99%. In one embodiment, the porosity of the nanoporous coating is from about 30% to about 99%. In one embodiment, the porosity of the nanoporous coating is from about 50% to about 99%. In one embodiment, the porosity of the nanoporous coating is from about 70% to about 99%. In one embodiment, the porosity of the nanoporous coating is about 90% or more. The nanoporous coating has tunable structure and properties on the polymer substrate. In a certain embodiment, the nanoporous coating is a tunable refractive index film.

In one embodiment of the present invention, the nanoparticles themselves are porous. That is, the nanoporous coating comprises nanoporous particles. Such nanoporous particles are then applied as a coating on the flexible or moldable polymer substrate. In one embodiment, the composite polymer-nanoporous film of the present invention includes a nanoporous coating comprising nanoporous particles of about 100 nm or less in their smallest dimension. In another embodiment, the nanoporous coating comprises nanoporous particles of about 200 nm or less in their smallest dimension. In another embodiment, the nanoporous coating comprises nanoporous particles of about 300 nm or less in their smallest dimension.

Another aspect of the present invention is directed to a method of making a tunable nanoporous film on a flexible or moldable polymer substrate, comprising: preparing a flexible or moldable or elastic polymer substrate; preparing a nanoporous coating; and depositing said nanoporous coating on said polymer substrate, under conditions effective to form one or more layers of said nanoporous coating on said polymer substrate. In one embodiment, the flexible or moldable polymer substrate is loaded into a high vacuum, oblique-angle electron beam deposition chamber. The nanoporous coating comprises a composition comprising nanoparticles of about 100 nm or less in their smallest dimension.

For the present invention, the coating may comprise either organic or inorganic nanoparticles. Examples of organic nanoparticles are carbon nanotubes or nanospheres. The nanoparticles can also be inorganic nanoparticles. Suitable inorganic particles are for example oxide particles. Preferred oxide particles are particles of an oxide selected from the group of aluminum oxide, silicon oxide, zirconium oxide, titanium oxide, antimony oxide, zinc oxide, tin oxide, indium oxide, and cerium oxide. It is also possible to use a mixture of particles from different oxides or to use particles of mixed oxides.

The nanoporous coating is selected from the group consisting of CdS, CdSe, PbSe, CdTe, PbS, PbSe, PbTe, ZnS, ZnSe, $Bi_2S_3$, $Bi_2Se_3$, $Bi_2Te_3$, HgS, HgSe, HgTe, InP, InAs, and core/shell CdSe/ZnS, Si, Ge, GaAs, InGaAs, InP, SiGe, CdSe/CdS, InP/CdSe, InP/ZnS, InP/ZnSe, InAs/CdSe, InAs/ZnSe, and combinations thereof. In another embodiment, the nanoporous coating is selected from the group consisting of metals such as Cu, Fe, Ti, Co, Mn, Zn, Au, Ag, Cr, Pd, Pt, Al, and alloys and combinations thereof. In yet another embodiment, the nanoporous coating comprises at least one compound selected from a group consisting of aluminum oxide, silicon oxide, zirconium oxide, titanium oxide, antimony oxide, zinc oxide, tin oxide, indium oxide, cerium oxide, and combinations thereof. In one embodiment, the nanoporous coating comprises silicon dioxide, titanium dioxide, or a combination thereof. The refractive index of the coating and effective refractive index of the coating/air interface can in part be tuned by the choice of oxide used. In one embodiment, the nanoparticles have one or more reactive organic groups on their surface. In another embodiment, the majority of the nanoparticles are reactive nanoparticles. The as-deposited surface of a metal oxide is characterized by hydroxyl functional groups, making it an excellent target for siloxane-based chemical reactions. By treating the surface with either a vapor or a solution based chemistry, the wettability of the surface can be controlled.

The nanoparticles are synthesized by methods such as colloidal synthesis, vapor-liquid-solid and related growth techniques, sonochemical synthesis, synthesis in reverse micelles, laser pyrolysis and arc discharge. Colloidal synthesis allows obtaining nanoparticles of different materials with the most precise control over particle size, shape, and monodispersity. The size of the particles is controlled by choice of surfactants (stabilizing ligands), precursors, and reaction conditions (solvent, concentrations of precursors and stabilizing agents, temperature, etc.). The shape of the particles is controlled by tailoring growth kinetics of different facets of crystalline nanoparticles. Oblique-angle deposition is a geometrically driven growth process. As material accumulates on the surface, first small nucleation sites begin to form randomly on the surface. These then begin to form islands of height variation. As deposition continues, the islands of height variation form shadowed regions where the incident vapor flux can no longer reach. The material then begins to preferentially deposit on the islands. Competitive growth occurs, where only the 'largest' islands survive and then form nanorods or other nanostructures.

Research has shown nonporous optical coatings deposited on polymers. In the present invention, however, the inventors demonstrated that when air is introduced into a suitable nanoporous material having a nanometer-scale pore structure, such nanoporous coatings are prepared that have relatively low dielectric constants ("k"). For example, nanoporous films prepared from silica, i.e., silicon-based materials, like air, have a low dielectric constant (air has a dielectric constant of 1).

In the instant invention, the inventors found nanoporous silica materials to be attractive because it is possible to control the pore size, and hence the density, mechanical durability and dielectric constant of the resulting nanoporous coating. In addition to a low k, nanoporous coatings or films of the present invention offer other advantages including: 1) thermal stability to 900 degrees Celsius, 2) substantially small pore size and large surface area, i.e., at least an order of magnitude smaller pore size in scale than microelectronic features, 3) preparation from materials such as silica are widely used in semiconductors, 4) high porosity in silica materials leads to a lower dielectric constant than would otherwise be available from the same materials in nonporous form, and 5) the ability to easily and effectively deposit the nanoporous coating on a substrate as taught herein, achieving a desired outcome.

Density (or the inverse, porosity) is an important parameter of nanoporous coatings. Density controls the dielectric constant of the material, and this property is readily varied over a continuous spectrum from the extremes of, for example, an air gap at a porosity of 100% to a dense silica with a porosity of 0%. As density increases, dielectric constant and mechanical durability increase but the degree of porosity decreases, and vice versa. Thus, the teachings of the present invention can be applied such that the density range of nanoporous coatings can be optimally balanced between the desired range of low dielectric constant and the mechanical properties acceptable for the desired application.

A number of substrates may be used as a substrate in the presently taught method. For example, suitable substrates are flat or curved, rigid or flexible substrates. Example substrates include polycarbonate, polyester, polyvinyl acetate, polyvinyl pyrollidone, polyvinyl chloride, polyimide, polyethylene naphthalate, polytetrafluoro ethylene, nylon, or similar flexible or moldable materials. Substrates for use in display applications include, for example, glass, polynorbornene, polyethersulfone, polyethyleneterphtalate, polyimide, cellulose triacetate, polycarbonate and polyethylenenaphtalate.

In one embodiment, the polymer substrate comprises at least one compound selected from the group consisting of polycarbonate, polycarbonate film (LEXAN®), polyester, polyester film (polyethylene terephthalate, PET), polyimide, polyolefin, polyolefin film (shrink wrap), polyethylene oxide (PEO), poly(methyl methacrylate) PMMA, nylon, silicone, rubber, synthetic rubber, vinyl, polystyrene, biopolymer, conductive polymer, and combinations thereof. In another embodiment, the nanoporous coating comprises nanoparticles of about 100 nm or less in their smallest dimension.

In one embodiment, the composite film according to the invention comprises an adhesion promoter. An adhesion promoter enhances the adhesion between the coating of the present invention and its substrate. In this way the scratch resistance of the coating is also improved. Examples of suitable adhesion promoters are compounds having at least one reactive group capable of reacting with the groups at the surface of the nanoparticles, and further have at least one reactive group capable of reacting or physically interacting, e.g. H bonding with the substrate. In one embodiment, nitrogen and hydrogen plasma treatments of the polymer substrate lead to high adhesion enhancement, which is attributed to the decrease of the oxygen concentration at the polymer surface.

Examples of commercially available adhesion promoters include but are not limited to SILAACE 5310, 5311, 5320, 5321, 5330, 5510, 5520, 5530, 5610, 5620, 5710, 5810 (manufactured by Chisso Corp.), Silquest A-174NT (manufactured by OSI Specialties—Crompton Corp.), SH6062, AY43-062, SH6020, SZ6023, SZ6030, SH6040, SH6076, SZ6083 (manufactured by Toray-Dow Corning Silicone Co., Ltd.), KBM403, KBM503, KBM602, KBM603, KBM803, KBE903 (manufactured by Shin-Etsu Silicone Co., Ltd.), and the like.

Also acidic adhesion promoters such as acrylic acid may be used. Phosphate esters such as Eb168 or Eb170 from UCB are feasible adhesion promoters. The adhesion promoters may be used in an amount of 0.1-10 wt-% of the total solids in the mixture. Preferably the adhesion promoter is used in an amount of 5-10 wt-%. For adhesion to polymeric substrates such as, for example polyethylene terephthalate (PET) and/or cellulose triacetate (TAC) the above adhesion promoters are feasible. For adhesion to polymeric substrates, good results are obtained with epoxy functional acrylate or methacrylate compounds.

As discussed above, the nanoporous coatings of the present invention have different physical properties than their dense counterparts. Moreover, Applicants point out that the nanoporous coatings of the present invention are 'tailorable' across a wide range of physical, chemical, optical, electrical and structural characteristics. That is, Applicants have discovered that by controlling the specific structural characteristics of such nanoporous coatings, the physical properties of a coating may be arbitrarily tailored within a range of desired values. This allows nanoporous coatings to be custom designed for a wide variety of application specific requirements. These unique properties and precise tailorability of physical properties in the present invention are not available with currently available material systems.

Fabrication of nanostructured films is accomplished by, but not limited to, oblique-angle deposition by electron beam evaporation that utilizes a geometrically-controlled deposition process. Nanoporous films which were fabricated utilizing a geometrical growth process have demonstrated precise control over film morphology as well as other important physical properties including density, refractive index, electrical conductivity, thermal conductivity, polarization, and mechanical durability. However, a significant limitation of nanoporous materials traditionally fabricated by geometrical methods exists. Due to the fundamental requirements of the geometric growth process, such films have been solely fabricated on smooth, planar substrates that are neither flexible nor easily moldable such as silicon or glass (i.e. flat surfaces). By limiting the application of nanoporous coatings to such flat, rigid surfaces, the list of potential uses and functionalities of such films is drastically reduced. The presently taught and claimed invention overcomes this obstacle of the currently available technology.

The nanoporous coating can be applied to the substrate to provide a nanometer-scale texture or roughness to the surface. The coating can be nanospheres such as, for example, silica nanospheres, titania nanospheres, polymer nanospheres (such as polystyrene nanospheres), or metallic nanospheres. The nanoporous coating comprises gold, silver, silicon dioxide, or titanium dioxide. The nanoparticles can have diameters of, for example, between 1 and 1000 nanometers, between 10 and 500 nanometers, between 20 and 100 nanometers, or between 1 and 100 nanometers in their smallest dimension. In one embodiment, the nanoporous coating comprises particles ranging from about 200 nm or less in their smallest dimension. In another embodiment, the nanoporous coating comprises particles ranging from about 100 nm or less in their smallest dimension.

In one embodiment, the nanoporous coating comprises particles ranging in diameter from about 50 nm to about 150 nm in their smallest dimension. In another embodiment, the nanoporous coating comprises particles ranging in diameter from about 1 nm to about 100 nm in their smallest dimension. In one embodiment, the nanoporous coating comprises particles of about 100 nm in their smallest dimension. In one embodiment, the nanoporous coating comprises particles of about 50 nm in their smallest dimension.

The nanoporous coating can be a tunable refractive index film and can be deposited on said flexible or moldable polymer substrate. In some cases, the composite polymer-nanoporous film has a plurality of uniformly or randomly distributed nanopores. The nanoporous coating comprises organic particles such as carbon nanotubes or nanospheres, or alternatively, the nanoporous coating comprises inorganic particles. In certain embodiments, the nanoporous coating comprises one or more metals, non-metals, or combinations thereof.

The coating or nanoporous film may be applied onto the substrate by any process known in the art, including for example, spin coating, dip coating, spray coating, flow coating, meniscus coating, capillary coating and roll coating. In one embodiment, the coating according to the invention is applied in a single layer. In one embodiment, the coating is applied on an existing coating. In one embodiment, an adhesion promoter is used to aid in the adherence of the nanoporous coating to the surface of the flexible or moldable polymer substrate.

In one embodiment, the method for making nanoporous coatings is by geometric methods using the general category of Physical Vapor Depositions including: i) electron beam deposition (using energetic electrons to evaporate source material, typically at low vapor pressures); ii) thermal evaporation (using resistive heating to evaporate source material, typically at low vapor pressures); iii) chemical vapor deposition (using gas precursors which react/decompose on the substrate surface to deposit desired film); iv) plasma vapor deposition (using a plasma, $N_2$, $O_2$, or Argon gasses to physically 'sputter' a solid source material); v) pulsed laser deposition (a high power laser ablates material from the target into a vapor); vi) cathodic arc deposition (a high power arc discharged at the target material creates highly ionized vapor); or a mixture of the above.

In one embodiment, the nanoporous coating is deposited on the substrate by a technique selected from the group consisting of oblique-angle electron beam deposition, filament evaporation, flash evaporation, physical evaporation, plasma vapor deposition, pulsed laser deposition, cathodic arc deposition, sputtering, chemical vapor deposition (CVD), and combinations thereof. Examples of CVD include electron resonant CVD, MOCVD, HFCVD, Cat-CVD, APCVD, LPCVD, and PECVD. In one embodiment the deposition method is either CVD or oblique-angle electron beam deposition. In another embodiment, the nanoporous coating is deposited by oblique-angle electron beam deposition. In another embodiment, the end product (i.e. the composite polymer-nanoporous film) has a reflectivity of less than 10% and a transmittance of more than 90%. That is, the composite polymer-nanoporous film has a reflectivity of less than 10% and a transmittance of more than 90%. This refers to optical reflectivity and transmittance.

The refractive index of the nanoporous film was tuned during fabrication to a designed value by adjusting the porosity of the optical film. Because the scale of the nanostructure of such coatings is much smaller than the wavelengths of light of interest, such coatings, to a good approximation, may be considered to be homogeneous mixtures of source material and air. Therefore, the effective refractive index in such films can be considered to be a weighted, linear-volume approximation of nanoporous material and air. Thus by controlling the porosity, the effective refractive index may be arbitrarly tailored from values of the bulk, to values close to that of the ambient medium, typically air. Experiments showed that $SiO_2$ coatings with tunable porosity fabricated by oblique-angle electron beam deposition can be deposited on polymer substrates. Further, these $SiO_2$ coatings or films show remarkably good 'adhesion' to the polymer substrate.

One aspect of the present invention is directed to a method for applying a nanoporous coating to a polymer substrate comprising: preparing said substrate; preparing a nanoporous coating composition comprising titanium dioxide, silicon dioxide, or a mixture thereof; and depositing said nanoporous coating on said substrate, under conditions effective to form one or more layers of said nanoporous coating on said substrate. In one embodiment, the nanoporous coating has antireflective properties, including a reflectivity of less than 10% and a transmittance of more than 90%. The tunable nanoporous film on a flexible or moldable polymer substrate is used in several applications, including in optics, photovoltaics, power sources or storage devices, catalysts, actuators and sensors. In addition to anti-reflection coatings, other applications include reflectance coatings (optical transmission filters). These work the same way, by controlling the refractive index and thickness of the layers of the optical coating and thereby controlling the optical transmittance.

In one embodiment, the articles comprising nanoporous coatings or films as presently taught herein have the advantage of being light weight, low cost, and may be produced for economies of scale. Chemical and physical mechanisms allow for a film's adhesion properties to a polymer substrate. To Applicants' knowledge, no research has been reported on nanoporous film's adhesion properties to polymer substrates, nor any research on nanoporous coatings on polymer substrates. The nanoporous coatings that Applicants deposited on flexible or moldable polymer substrates showed excellent adhesion properties. The adhesion mechanism for this is indicated to be the same as those reported for traditional dense nonporous films on Page 22 of 57 polymer substrates.

Applicants' invention provides for a significant improvement to nanostructured coating technology. Applicants teach nanoporous coatings on flexible or moldable polymer substrates. This new material system or article has several important new characteristics and functionalities previously unavailable to traditional dense coatings without pores, or nanostructured coatings on traditional flat substrates. These new and beneficial characteristics include: (1) this composite polymer-nanoporous film or article has tailored morphology of single and multi-layer nanostructured films fabricated on a variety of polymer substrates; (2) this new composite polymer-nanoporous film or article can be repeatedly bent and or flexed while retaining the nanoporous coating's tailored physical properties and structural integrity; (3) this new composite polymer-nanoporous film or article can be molded into arbitrary 3 dimensional shapes while retaining the nanoporous coating's tailored physical properties and structural integrity; and (4) this new composite polymer-nanoporous film or article also withstands stretching and shrinking while retaining the nanoporous coating's structural integrity.

To Applicants' knowledge, there is no existing nanoporous coating/polymer substrate composite as presently taught. In particular, to Applicants' knowledge there is no prior art teaching or suggestion of a composite polymer-nanoporous film, comprising: a nanoporous coating; and a flexible or moldable polymer substrate, wherein the nanoporous coating is on the surface of said polymer substrate and is tunable on said polymer substrate, as is taught in the present invention. The nanoporous coating has tunable structure and properties on the polymer substrate. In a certain embodiment, the nanoporous coating is a tunable refractive index film.

Tailorability: Applicants have demonstrated that nanoporous coatings of any porosity (1-99%) and a variety of nanostructures may be fabricated on a variety of polymer substrates. These nanoporous films maintain their structural properties and tailorability as well as when fabricated on flat surfaces such as silicon and glass substrates. Nanoporous materials of a wide variety of material types and structures are fabricated on polymer substrates including metals, dielectric compounds (e.g., metal or semiconductor oxides), and multi-material/composite and alloy systems.

Flexibility: Applicants have demonstrated that nanoporous films may be fabricated on a variety of polymers with specific structural and optical characteristics. One feature of the composite polymer-nanoporous film is that the nanoporous coatings exhibit good adhesion characteristics to the polymer substrates. As such, upon extreme and repeated bending (5 mm radius of curvature, 10+ times) of the composite polymer-nanoporous film (i.e. the flexible polymer substrate with the nanoporous coating on its surface), the composite polymer-nanoporous film retained its structural and optical characteristics. This capability is important at both the fabrication level, such as in roll-to-roll processing techniques, as well as in enabling a new desired property at the application level, for example, as flexible displays, and flexible solar cells.

Functionality: Applicants have demonstrated that single and multilayer nanoporous films can be fabricated on polymer substrates for a wide variety of functionalities. By controlling the porosity, thickness, and material type of the nanostructured films, specific properties can be designed for the coatings. As an example, in the optical area, Applicants fabricated multilayer antireflection coatings utilizing the presently taught composite polymer-nanoporous film. As an example, a polycarbonate polymer (LEXAN®) is used in optical applications for its durability, optical transparency, and it's excellent moldable/bendable characteristics. $SiO_2$ and $TiO_2$ are excellent materials for optical coatings because they are, for example, inert, thermally, electrically, and chemically. Therefore, for several applications, these two materials are used together. Optical coatings are only one type of application of nanostructured films on polymer substrates. Other uses include, but are not limited to, catalysts, gas and liquid sensors, and membranes.

Moldability: the fabrication of nanoporous films has typically been limited to coatings on flat, rigid surfaces. This greatly limits the list of available applications. The inventors of the instant application have demonstrated that a nanoporous coating/polymer substrate material system can be fabricated and subsequently molded into a variety of 3 dimensional shapes. Further, the nanoporous coatings retain their structural integrity and maintain their designed physical properties after molding, and even after the polymer substrate that they are coated on is bent back and forth.

Stretching and Shrinking: having made a nanoporous coating/polymer substrate material system, the inventors of the instant application further discovered that nanoporous coatings fabricated on polymer substrates are capable of surviving stretching and shrinking of the substrate while maintaining their structural integrity. This is a highly desired property, and is important, for example, when processing the coatings, e.g. by stretching a previously fabricated film around an arbitrary shape. This property of the nanoporous coating of maintaining its structural integrity even when the substrate that it is on is bent, stretched or shrunk, is also useful and desirable at the application level. For example, in cases where the ability to repeatedly alter the films' porosity due to shrinking and/or stretching of the substrate is a property of the application. For example, in flexible displays/solar cells. One can induce directionality in the coating, for example stretching the film in only one direction would increase the porosity in that plane, while the porosity stays the same in the perpendicular direction. This is useful for photonics applications. For example, an optical filter whose optical transmittance spectrum is controlled by changing the optical characteristics of the film through stretching and/or shrinking of a polymer substrate.

Tailorability, flexibility, moldability, and stretching/shrinking deformation properties of the presently taught composite polymer-nanoporous film (i.e. the flexible polymer substrate with the nanoporous coating on its surface) are unique and not even suggested by any available prior art. The teachings of the instant nanoporous coatings and methods apply to applications, including: optical coatings (solar cells, light emitting diodes, displays, fiber optics, lenses and mirrors), gas and liquid sensors, and productions of scale (roll-to-roll processing), catalysts, and hydrogen storage.

In the present invention, the nanoporous coating is firmly adhered to the flexible or moldable polymer substrate, and upon repeated bending of the composite polymer-nanoporous film, the composite polymer-nanoporous film retains its structural and physical characteristics. When the composite polymer-nanoporous film of the present invention is molded into one or more 3 dimensional shapes, the nanoporous coating retains its structural integrity and maintains its physical properties after molding. Moreover, when the composite polymer-nanoporous film is stretched or shrunk in one or more dimensions, the nanoporous coating retains its structural integrity and maintains its physical properties.

One aspect of the presently claimed invention is directed to functional single-layer and multi-layer nanostructured films on polymer substrates, as shown by the experimental results. In one embodiment, the nanoporous coating materials include metals (e.g., gold, silver, aluminum, titanium, and iron) and alloys; dielectrics (e.g., magnesium fluoride, silicon nitride, and aluminum nitride); conductive oxides (e.g., indium tin oxide); metal compounds (e.g., oxides, nitrides, sulfides, etc.); semi-metal compounds (e.g. gallium arsenide, gallium nitride, cadmium telluride, etc.); or a combination thereof. In one embodiment, the nanoporous coating materials include silicon dioxide ($SiO_2$) or titanium dioxide ($TiO_2$).

In one embodiment, the polymer substrate material is selected from a group consisting of polycarbonate film (LEXAN®), polyester film (polyethylene terephthalate, PET), poly(styene), polyimide film (KAPTON® tape), poly(ethylene oxide) PEO, poly(methyl methacrylate) PMMA, nylon, silicone, rubber, synthetic rubber, vinyl, polyolefin, biopolymer, and conductive polymers, and polyolefin film (shrink wrap).

The inventors of the instant application teach a composite polymer-nanoporous film system and method of fabrication of tunable refractive index nanoporous films on flexible polymer substrates. The inventors surprisingly discovered a composite polymers substrate/nanoporous coating, where the nanoporous coating ($SiO_2$) has a tunable porosity and can be fabricated by oblique-angle electron beam deposition and deposited on polymer substrates. These nanoporous coatings showed remarkably good adhesion to polymer substrates. This discovery enables the adhesion of nanoporous coatings, such as $SiO_2$ or $TiO_2$, on polymer substrates, allowing for deposition on flexible and/or moldable substrates while maintaining the optical and mechanical characteristics of the nanoporous coating.

In the present invention, the porosity of the film is dependent on several factors, including the angle of vapor incident flux. A film deposited at steeper angles will grow as a more porous film. However, material type (both substrate and deposited material), and temperature also affect film porosity at a given angle. The refractive index of the nanoporous coating can be tuned during fabrication to any desired value by adjusting the porosity of the optical film. For example, the depositing of the nanoporous coating on flexible polymer substrate as presently taught determines the porosity of the coating, and if the deposition angle is about 45 degrees, the porosity of the nanoparticle coating is from about 2% to about 25%. On the other hand, if the deposition angle is about 85 degrees, the porosity of the nanoparticle is from about 60% to about 90%.

These tunable nanoporous coatings have applications in the field of optics where the ability to fabricate tailored refractive index coatings on a variety of materials and shapes is of great importance. These nanoporous films are extended to multi-layer coatings as well as a wide variety of deposited materials for other applications, creating novel flexible and conformal composite polymer-nanoporous films. As an example of other applications, the composite polymer-nanoporous film as presently taught are used in the field of optics, photovoltaics, power sources or storage devices, catalysts, actuators and sensors.

Oblique-angle deposition is a geometrical growth process which uses a highly directional vapor flux to deposit nanoporous coatings. This growth process is self-organized. That is, no pretreatment of the substrate is necessary. These nanoporous coatings are superior for a variety of applications because their porosity and the ratio of air and deposited material can be controlled from that of a bulk material to 90% or more porosity. In certain embodiments, the highly porous nature of the deposited material provides for very high surface area. For example, 120 $cm^2$ of nanoporous coating per 1 $cm^2$ of substrate. This high surface area is a unique characteristic for nanoporous coatings, and is particularly relevant in applications including in catalysts, hydrogen storage, and sensors. This oblique-angle electron beam deposition process is illustrated schematically in FIG. 1.

In FIG. 1(a) of the oblique-angle deposition method, the substrate is angled 0 with respect to the normal incidence deposition material vapor flux. As the deposition material begins to deposit on the surface, small nucleation sites form which give rise to randomly distributed islands of material with height variations, FIG. 1(b). Because of height variations and the angle of deposition, shadowed regions are created where incident vapor flux can no longer deposit. Finally in FIG. 1(c), as deposition continues, deposition material preferentially deposits on these height variations that then begin to grow into nano-column like structures.

Figure 2:
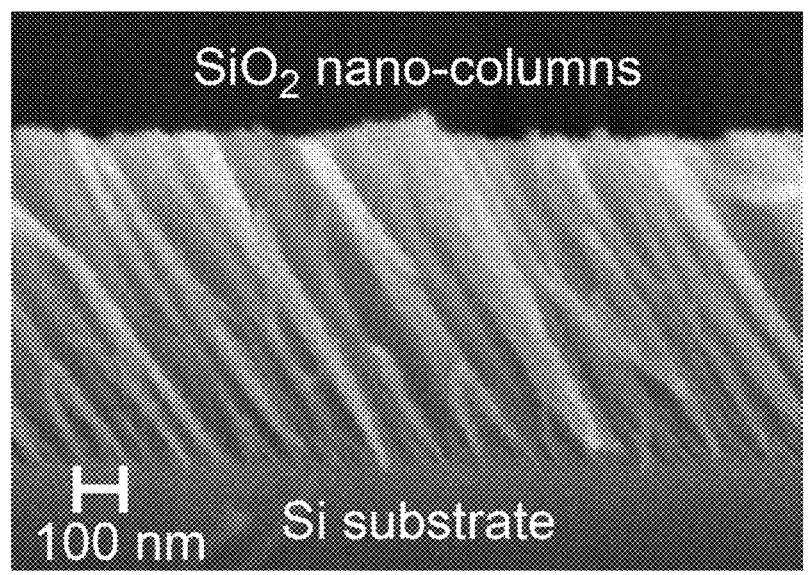
FIG. 2 shows nanoporous $SiO_2$ deposited on silicon substrate by oblique-angle electron beam deposition.

The porosity of the nanoporous coating is dependent upon several factors, including temperature, pressure, the angle and rotations of substrate (glancing-angle deposition or GLAD), and deposition rates. An example of highly nanoporous $SiO_2$ is shown in FIG. 2. In principle, any desired porosity and/or thickness of these nanoporous coatings may be achieved by control of the deposition angle. For example, if the deposition angle is about 85 degrees, the porosity of the coating is from about 60% to about 90%. Whereas, if the deposition angle is about 75 degrees, the porosity of the coating is from about 35% to about 65%. Whereas, if the deposition angle is about 60 degrees, the porosity of the coating is from about 10% to about 50%. Whereas, if the deposition angle is about 45 degrees, the porosity of the coating is from about 2% to about 25%. On the other hand, if the deposition angle is about 30 degrees or less, the porosity of the coating is about 20% or less. The instant experiments were conducted under near room temperature depositions, so as to avoid damaging the polymer substrates. Low pressures were used for evaporative techniques, so the evaporated gas travels in a straight line to the substrate. Higher pressures may reduce the geometric effects. Reactive gasses can be added to change the film stoichiometry. For example, in $TiO_2$, the inventors flowed $O_2$ to raise transparency of the coating or film. Temperature could be used to densify the coating, or to even achieve crystalline structure (as opposed to amorphous $SiO_2$ or $TiO_2$). Additionally, pretreatments to the substrate can also affect density or order of the film (i.e., preseeding the substrate to get uniformially distributed nanostructures).

In order to circumvent the randomness of nucleation and control the nanostructure morphology and location of the nanostructures, the polymer substrate is covered with regular arrays of uniform features. These features act as the initial seeds for nanostructure growth. Lithographic patterning and predeposition processing is used to accomplish this.

Nanoporous coatings or films are particularly important in the field of optics. Because the scale of the nano-columnar structures is much smaller than wavelengths of light, the nanoporous film may be considered a homogenous mixture of air and the source material. There is a direct relation between the porosity and the refractive index of such nanoporous coatings. By controlling the deposition angle, the porosity and thus refractive index is controlled. Refractive index is an important quantity in virtually all optical applications, including in, for example, antireflection coatings, reflectance filters, and distributed Bragg reflectors.

The inventors of the instant application have deposited a nanoporous coating of $SiO_2$ by oblique-angle electron beam deposition on polymer substrates, and showed that such nanoporous coatings have excellent adhesion to such substrates. Further, the structural and optical characteristics of these nanoporous coatings are well preserved when the flexible substrate is bent, even if bent multiple times. The ability of these nanoporous coatings to be flexed multiple times on polymer substrates allows for mass production, for example in roll-to-roll processing techniques. Robust optical coatings able to withstand roll-to-roll process are particularly important in thin film, and organic solar cells. Additionally, due to their ability to withstand bending, these tunable porosity coatings are conformable and such nanoporous coatings are applied to moldable, and or non-uniform surfaces, allowing for a greater variety of conceivable coating applications.

According to the presently taught method, multi-layer films with the same tunable porosity flexible properties can also be deposited. Further, these nanoporous coatings are not limited to only $SiO_2$ coatings, but are applicable to a wide variety of material types, such as conducting oxides which are relevant in display technologies such as TV screens, computer monitors, and portable hand held devices. Optics is one area of application for such coatings. The ability to control the porosity of deposited nanoporous coatings on polymer substrates has other applications, including for example in the field of photovoltaics, power sources or storage devices, catalysts, actuators and sensors.

The inventors of the present application teach nanoporous coatings or films deposited on polymer substrates with properties, including 1) tailored porosity, single- and multi-layer nanoporous films can be fabricated on polymer substrates; 2) flexibility of such films in that they can be repeatedly bent and or flexed and remain structurally and optically intact; 3) moldability of the made nanoporous films on polymer substrates into 2 dimensional and 3 dimensional shapes, wherein the film remains structurally and optically intact; and 4) stretching/shrinking deformation ability of the nanoporous coatings, wherein the presently taught films can withstand stretching and shrinking and remain structurally and optically intact. Nanoporous coatings of a wide variety of material types may be fabricated according to the teachings of the present invention.

In the present composite polymer-nanoporous film, the nanoporosity of the coating on the polymer substrate was controlled by the vapor flux incident angle. The primary mechanism is by ballistic shadowing. Due to the incident angle of vapor flux, shadowed regions form, where vapor flux can no longer reach and deposit. Materials near normal incidence are similar in structure to dense films, but have voids. While films at steep vapor flux incident angles actually begin to form, individual nanocolumn-like shapes form that are randomly distributed on the surface. Examples of nanostructures include: i) simple rods or columns of controlled size/location, ii) tapered rods or columns of controlled size/location, iii) smooth or rigid spirals or helical structures (smooth look like springs and rigid consist of straight segments that change direction at nodes), and iv) lever shapes (2 or more segments that look like a cantilever).

The primary mechanism to control the shape of the nanostructure of such coatings (GLAD) is by sample/substrate angle, and by rotating the substrate at different angles and speeds. One factor in determining the morphology of GLAD fabricated films is the effect of shadowing during deposition. In order to control the structure of the individual columns, the shadowing is controlled. Temperature also plays a role. By raising the temperature of the sample/substrate, the surface diffusion effects of evaporated material are increased, thus densifying the film. By raising the temperature high enough, instead of amorphous material being deposited, material can be deposited that has crystalline structure.

There are four archetypal columnar microstructures which illustrate how substrate motion affects structure. If the substrate is held at an oblique angle and not rotated, columns will form tilted toward the source (tilted columnar structure). By rotating the substrate 180° at fixed growth intervals, a stack of columns with alternating directions will form (chevronic or zig-zag columns). If the substrate is slowly and continuously rotated, the columns will be sculpted into a chiral shape (helical columns). The pitch of these helices, that is a measure of the vertical periodicity, is defined by the amount of vertical growth during a 360° rotation of the substrate. As the angular velocity of the substrate rotation is increased, the pitch of the helical structure will approach the diameter of the column. When this occurs, the helical geometry is lost and the structure degenerates into vertically oriented columns (vertical columns). The ability to sculpt the film and access the various morphologies is provided by the trajectory of the incident vapor flux relative to the substrate surface during deposition.

One aspect of the present invention is directed to a method for fabricating a tunable nanoporous film on a flexible or moldable polymer substrate, said method comprising: preparing a nanoporous coating composition comprising nanoparticles of about 100 nm or less in their smallest dimension; loading a flexible or moldable polymer substrate into a high vacuum, electron beam deposition chamber; and depositing said nanoporous coating composition on said flexible or moldable polymer substrate, such that one or more layers of said nanoporous coating form on said polymer substrate. In one embodiment, the nanoporous coating is deposited on the substrate by oblique-angle electron beam deposition. In another embodiment, the nanoporous coating composition is applied to the substrate such that it forms a coating of 10 nm to 2000 nm on the surface of said substrate. In a related embodiment, the high vacuum is at 2E-6 mbarr. The porosity is controlled by changing the fixed deposition angle from 0 to about 87 degrees. The deposition rate is about 0.2 nm/s. The tunable nanoporous film on a flexible polymer substrate (i.e. the composite nanoporous coating/substrate film) can be bent, molded, stretched, or shrunk, without affecting properties of the film.

The presently taught composite polymer-nanoporous film and related novel methods have many applications, including in the field of optics, photovoltaics, power sources or storage devices, catalysts, actuators and sensors. It would be apparent to a person of ordinary skill in the art how to apply the teachings of the presently claimed invention to these matters. For example, titanium dioxide is used as an electrode material in dye sensitized solar cells and the efficiency of the device improves when the electrode has a high surface area. (J. Vac. Sci. Technol. A 25 (5), p. 1317-1335, 2007).

Each of the applications and patents cited in this text, as well as each document or reference cited in each of the applications and patents (including during the prosecution of each issued patent; "application cited documents"), and each of the PCT and foreign applications or patents corresponding to and/or paragraphing priority from any of these applications and patents, and each of the documents cited or referenced in each of the application cited documents, is hereby expressly incorporated herein by reference. More generally, documents or references are cited in this text, either in a Reference List before the paragraphs, or in the text itself; and, each of these documents or references ("herein-cited references"), as well as each document or reference cited in each of the herein-cited references (including any manufacturer's specifications, instructions, etc.), is hereby expressly incorporated herein by reference.

EXAMPLES

The invention, having been generally described, may be more readily understood by reference to the following examples, which are included merely for purposes of illustration of certain aspects and embodiments of the present invention, and are not intended to limit the invention in any way.

Applicants conducted several experiments, demonstrating that tunable-porosity nanoporous coatings or films can be deposited on polymer substrates and that these nanoporous films have excellent adhesion to such substrates and preserve the optical and mechanical properties of the film.

Using the method of fixed oblique-angle electron beam deposition, $SiO_2$ and $TiO_2$ nanoporous coatings of a variety of porosities and thicknesses were fabricated on various polymer substrates. A tilt-angle cross sectional SEM in FIG. 3a illustrates an example of such a nanoporous film fabricated on a polymer substrate (a 200 nm thick, 65% nanoporous $SiO_2$ film was deposited on a Polyimide tape substrate) and fixed to a glass slide.

Figure 3:
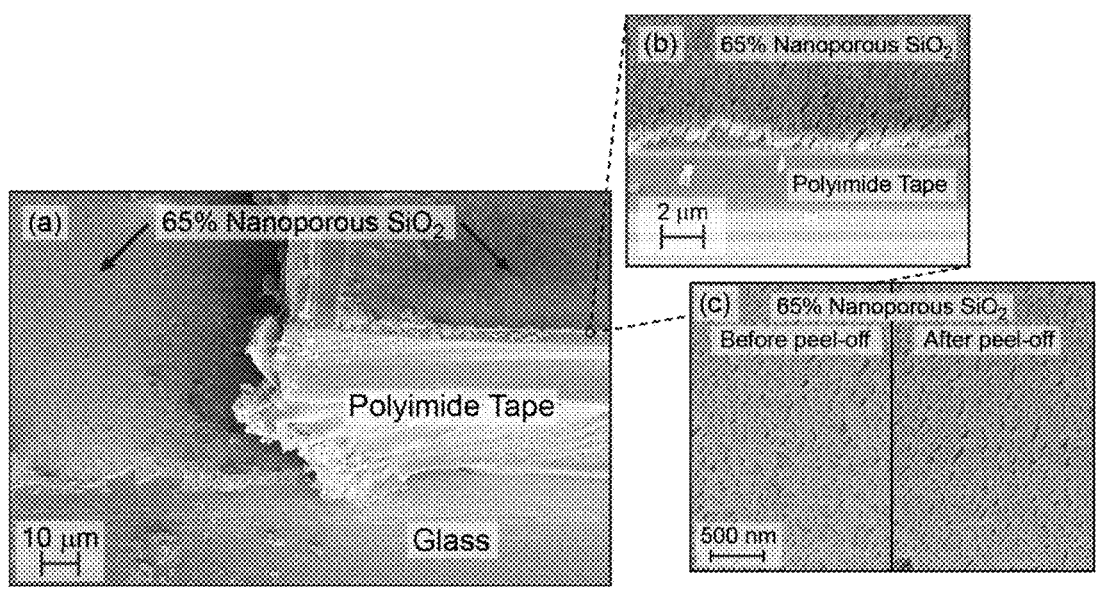
FIG. 3 shows a scanning electron micrograph (SEM) taken at a tilt angle of 25° of nanoporous $SiO_2$ deposited by oblique-angle deposition on KAPTON® tape.

In the first experiment, 200 nm thick highly porous (70% porosity) $SiO_2$ was deposited by oblique-angle deposition at an 80° angle on a flexible polymer (KAPTON® tape) substrate attached to a glass slide. After the nanoporous $SiO_2$ was deposited, the tape substrate was cut into two pieces. One piece of tape remained attached to the glass slide. The second piece of tape was fully peeled off from the glass slide and then reattached to the glass slide. SEM images at a 25° tilt angle, FIG. 3, were taken of both nanoporous $SiO_2$ films deposited on a polymer substrate. FIG. 3 (a) shows the nanoporous $SiO_2$ without peel off. FIG. 3 (b) shows the nanoporous $SiO_2$ after peel off and reattachment to the glass slide. The images surprisingly show that the nano-columnar structure survived the peel off process, and that the structure of the nanoporous $SiO_2$ coating is well preserved.

Figure 4:
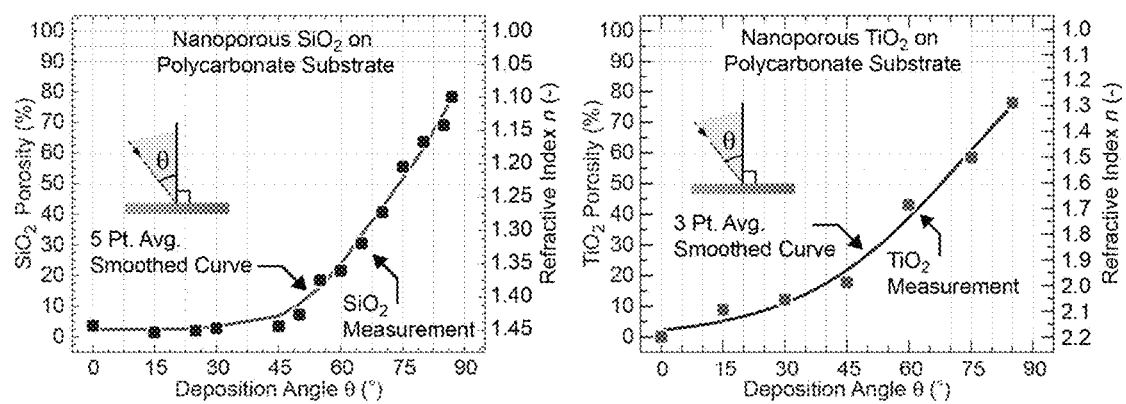
FIG. 4 shows porosity and refractive index plotted as function of deposition angle of nanoporous (a) $SiO_2$ and (b) $TiO_2$ films deposited by oblique-angle electron beam deposition. Included are 5 point (for $SiO_2$ experiment) and 3 point (for $TiO_2$ experiment) smoothing curves through the experimental data points.

In FIG. 3, the nanoporous coating is clearly visible on both the polyimide tape and glass substrates, and in FIG. 3b, the nanostructure of the nanoporous $SiO_2$ coating is readily apparent. In order to demonstrate the nanostructure of such films remains tailorable on polymer substrates, a variety of nanoporous $SiO_2$ and $TiO_2$ films were fabricated on optically transparent polycarbonate substrates across a wide range of refractive index values (n=2.2–1.09). The refractive index and thicknesses of these nanoporous coatings were characterized using variable angle ellipsometry. Plotted in FIG. 4 are the measured refractive index values for $SiO_2$ and $TiO_2$ nanoporous films as a function of deposition angle, 0.

Using ellipsometry methodology, the inventors of the instant application surprisingly found an intermixed layer of polycarbonate substrate and nanoporous film. To account for this physically intermixed layer, a 20-50 nm 50% polymer/50% nanoporous film layer was added to the ellipsometry fitting model. As can be seen in the plots in FIG. 4, both $SiO_2$ and $TiO_2$ film porosity curves are smooth and well conformed, indicating that films of any porosity or refractive index may be fabricated on polymer substrates. This result indicates that other forms of nanostructured films will exhibit similar excellent structural control on polymer surfaces.

It is well known that many types of polymers have favorable plastic characteristics. Optical measurements were taken to investigate the behavior of nanoporous coatings fabricated on polymer substrates that are then subsequently bent, molded or stretched. Due to the sensitivity of optical measurements to changes in an optical coating's physical parameters (such as refractive index, thickness, absorption and scattering), such optical coatings can be used as good diagnostic tools in understanding the effects of deformations in the nanoporous coating/polymer material system.

Figure 6:
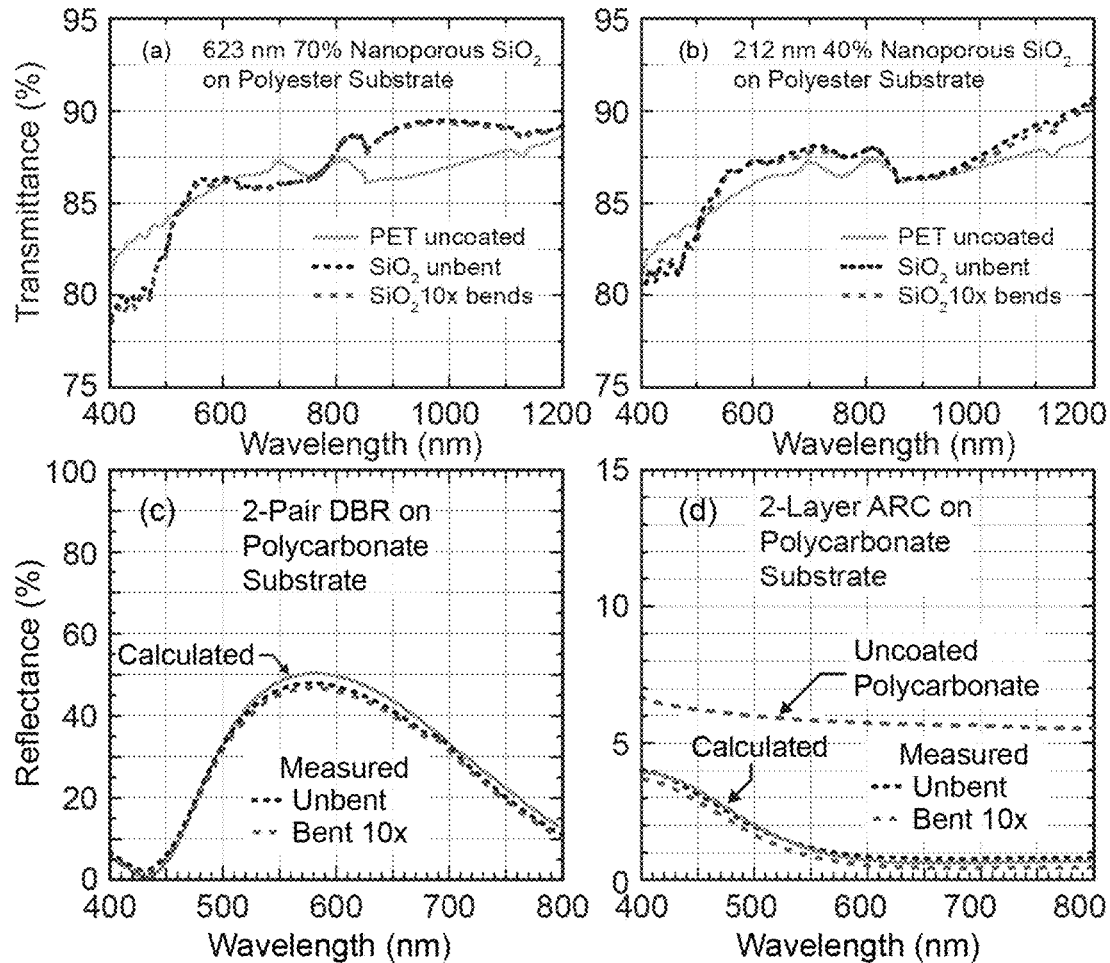
FIG. 6 (a, b) show measured transmittance values through 623 nm, 70% nanoporous $SiO_2$ coating, and 212 nm, 40% nanoporous $SiO_2$ coating, on polyester substrates before and after bending 10 consecutive times about a radius of curvature of 5 mm. The coatings were deposited by oblique-angle electron beam deposition on 3M™ transparency film. Transmittance was measured before and after bending each film 10 times.

Experiment 2: In a second experiment, approximately 600 nm thick 70% porous $SiO_2$ was deposited by oblique-angle deposition on 3M™ transparency film. Three transmittance measurements using a broadband light source and spectrometer were taken of the transparency film. In the first measurement, the reference transmittance of an uncoated transparency film was taken. In the second measurement, the transmittance of the transparency film with the 600 nm coating of 70% nanoporous $SiO_2$ was taken. In the third measurement, the transparency film with the nanoporous coating was bent 10 times (back and forth) around a radius of curvature of 5 mm, a transmittance measurement was taken after this procedure. This procedure was repeated for a 200 nm thick 40% nanoporous film. FIGS. 6 (a) and (b) show the results of these transmittance measurements. As the results show, the nanoporous $SiO_2$ coatings on the transparency film acted as antireflection films. Further, the optical qualities of the nanoporous coating were well preserved after bending the film severely 10 times.

Applicants designed and fabricated single- and multi-layer nanoporous optical films on polycarbonate substrates. These optical coatings were characterized using transmittance and reflectance measurements before and after subjecting the nanoporous coating/polymer material system to bending. The procedure for these experiments is as follows: first, various nanoporous coatings were designed and fabricated on a polycarbonate substrate: i) single-layer coatings of $SiO_2$, ii) a 2-layer AR coating, and iii) a 4-layer reflectance coating. Transmittance and reflectance of such coatings are calculated by a transfer matrix method. Provided with the refractive index, thickness and absorption of each layer, this method can calculate the reflectance and transmittance characteristics of a coating and substrate as a function of wavelength and refractive index. Second, the optical coatings were characterized using normal incidence reflectance and transmittance measurements. Third, the nanoporous coatings/polycarbonate system were subjected to bending around a radius of curvature of 5 mm, both in concave and convex directions, bending was repeated 10 times. Finally, the optical reflectance and transmittance measurements were repeated. The measured results of these experiments are plotted in FIG. 6.

FIGS. 6 (a) and (b) show the measured transmittance through uncoated and coated transparent polyester sheets with (a) an optically thick (623 nm), highly nanoporous (70%) $SiO_2$ coating, and (b) an optically thin (212 nm) and low porosity (40%) $SiO_2$ coating. No significant change in optical transmittance was measured for either nanoporous coating as a result of bending. FIGS. 6 (c) and (d) also plot the measured and calculated reflectance of (c) a 4-layer DBR coating consisting of alternating layers of high-porosity $SiO_2$ and $TiO_2$ nanoporous layers on a transparent polycarbonate substrate and (d) a 2-layer antireflection coating on polycarbonate substrate.

Figure 8A:
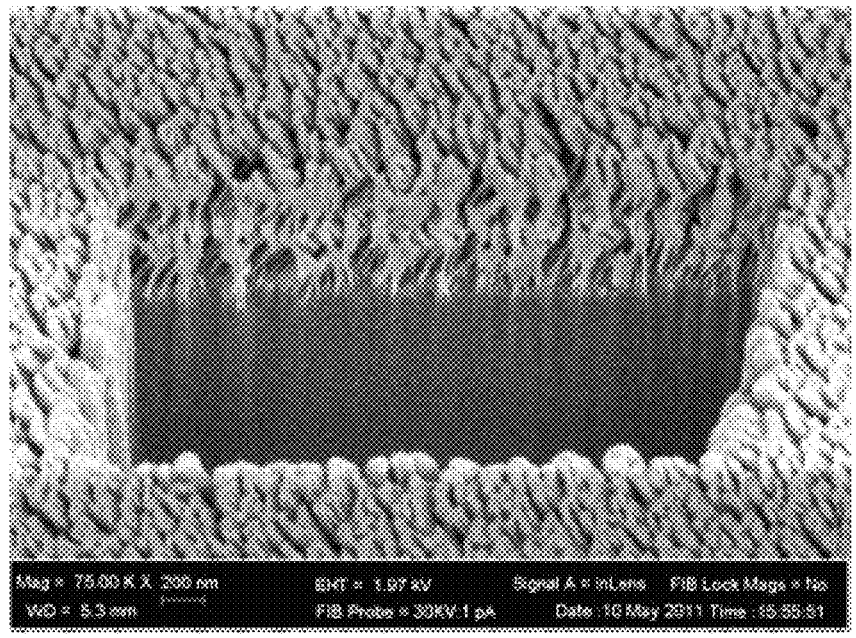
FIG. 8 shows SEM micrographs of nanoporous $SiO_2$ and $TiO_2$ a 4-layer (FIG. 8a) and 6-layer (FIG. 8b) optical reflection coating (DBR) fabricated on a polycarbonate substrate (with no bending or molding).
FIG. 8c shows SEM micrograph of alternating 4-layer nanoporous $SiO_2$ and $TiO_2$ layers, optical reflection coating (DBR) on a polyimide (KAPTON® tape) substrate imaged after severe bending of the coating/polymer substrate.
Figure 8B:
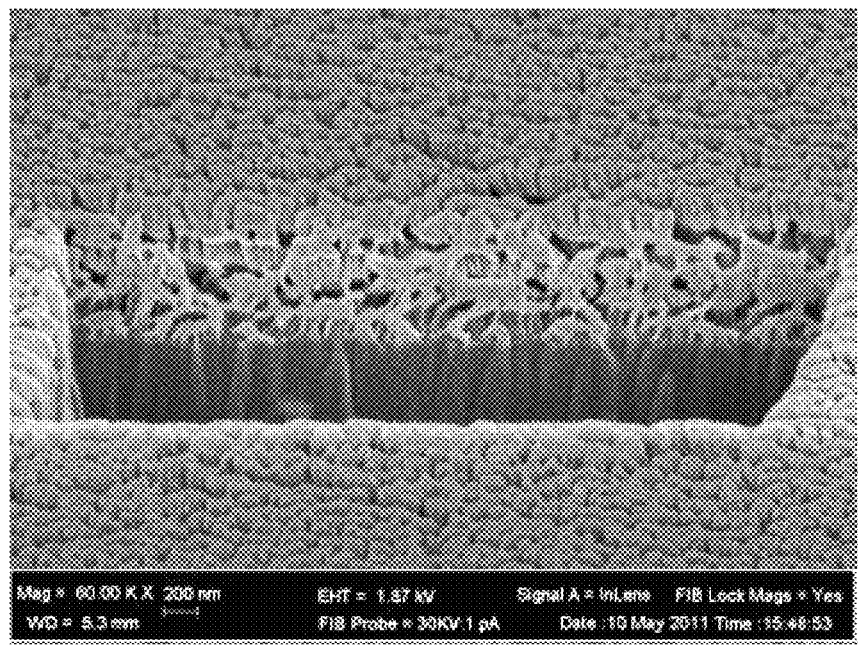
Figure 8C:
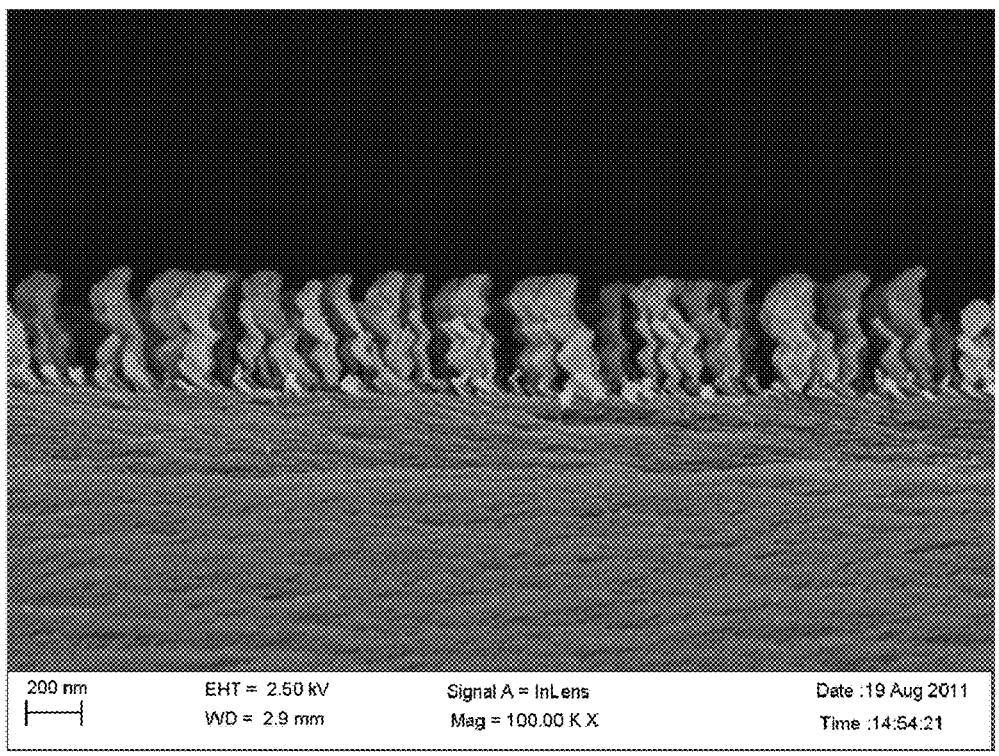

The calculated structure parameters for these DBR and AR coatings can be found in FIGS. 7 (a) and (b) respectively. For both the DBR and AR coatings, calculations assume a nanoporous/polycarbonate intermix layer as discussed above. Excellent agreement was found between calculated and measured results, and virtually no difference was measured between reflectance measurements before and after repeated bending. As visual evidence, FIG. 3 (c) shows an SEM image of highly nanoporous $SiO_2$ film on a polyimide substrate taken before and after such bending. No visual evidence of change to the nanostructure was seen. FIG. 8c also supports this conclusion, showing SEM micrograph of alternating 4-layer nanoporous $SiO_2$ and $TiO_2$ layers, optical reflection coating (DBR) on a polyimide (KAPTON®) tape) substrate imaged after severe bending of the coating/polymer substrate.

Figure 5:
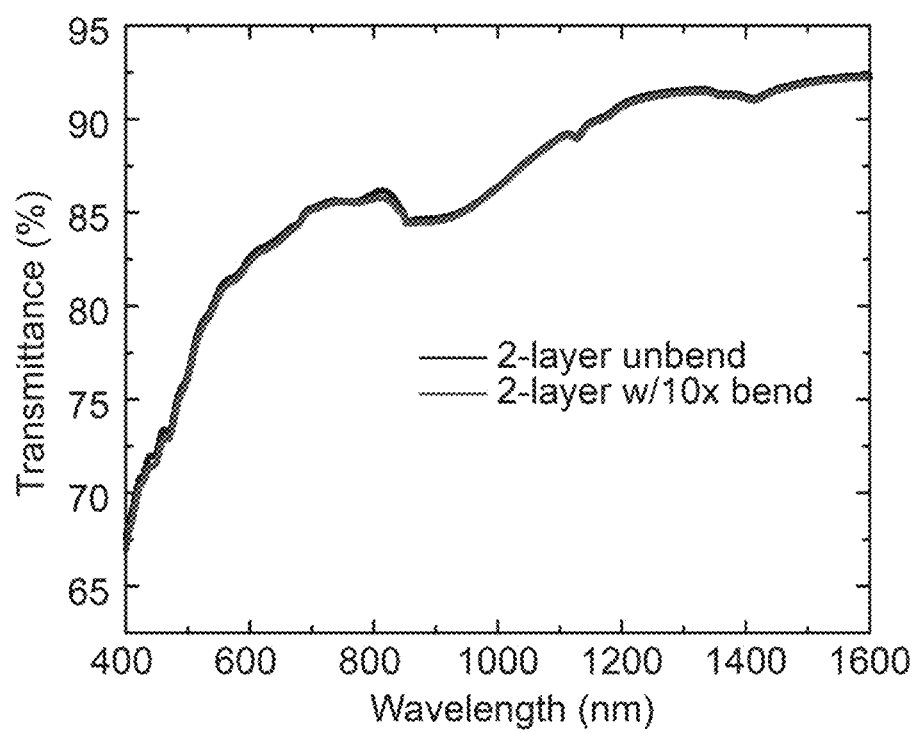
FIG. 5 shows transmittance measurements of a 2-layer nanoporous $SiO_2$ coating on 3M™ transparency film. Transmittance was measured before and after bending each film 10 times around a radius of curvature of 5 mm.

In a third experiment, a 2-layer nanoporous $SiO_2$ coating was deposited on 3M™ optical transparency film. The first layer consisted of 45% nanoporous $SiO_2$, with an approximate thickness of 100 nm. The second layer consisted of 80% nanoporous $SiO_2$, also approximately 100 nm thick. As in experiment 2, the transmittance of the multi-layer coating was measured before and after being bent around a radius of curvature of 5 mm, 10 times (back and forth). In FIG. 5, we see that the 2-layer coating measures nearly identical transmittance curves before and after the application of bending of the transparency film. Such adhesion is important at the fabrication level, where an optical coating needs to be applied to a curved surface, for example, a windshield for a car, a cockpit window for an airplane, a curved lens or mirror. Or at the application level, such as flexible displays, or flexible solar cells.

Experiment 4: having successfully demonstrated that such nanoporous films can be deposited on planar polymer substrates and then molded into 2 dimensional or 3 dimensional shapes while maintaining their structural and optical characteristics, the inventors further tested the capabilities of these nanoporous films to withstand a molding process. For this, multi-layer optical reflection coatings were designed and fabricated on a polymer (LEXAN®) substrate utilizing the tunable refractive-index nanoporous material system. Alternating layers of nanoporous $SiO_2$ and $TiO_2$ were deposited on a planar LEXAN® substrate. FIG. 8 shows SEM micrographs of two optical reflection coatings, a 4-layer (2-pair) Distributed Bragg Reflector (DBR) and a 6-layer (3-pair) DBR.

Figure 9:
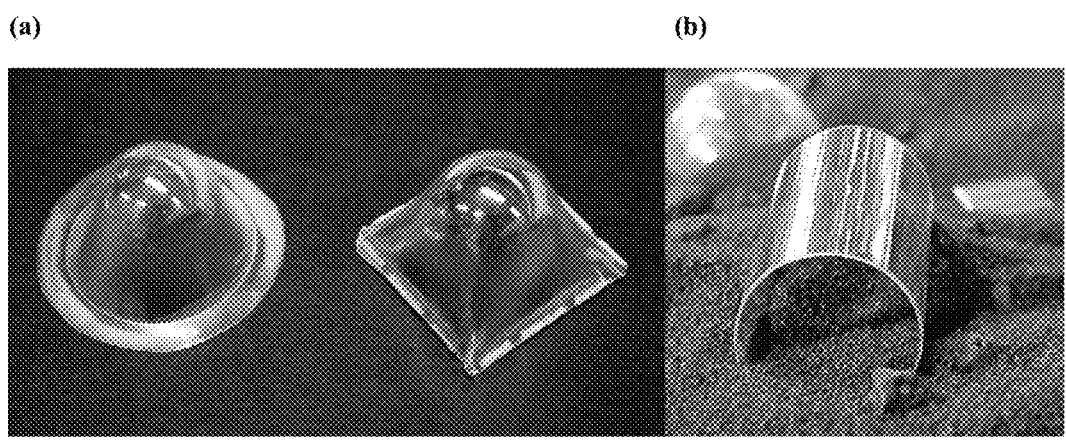
FIG. 9 shows a photographic image of DBR coatings consisting of multi-layer nanoporous $SiO_2$ and $TiO_2$ films deposited on polycarbonate substrates and subsequently heat molded into various three dimensional shapes.

After deposition of the optical reflection coatings, the LEXAN® (a polycarbonate) substrate was heated to 165° C. and mechanically indented with a 1 inch diameter metal sphere. After the molding process, the coatings were visually inspected. As can be seen in FIG. 9, specular reflections are clearly visible in the top half of the hemisphere, direct evidence that the nanoporous optical coating remained structurally intact and optically functional.

These results demonstrate that not only can nanoporous coatings be accurately designed and fabricated on polymer surfaces, but that such coatings exhibit excellent adhesion characteristics and are able to retain their important structural and physical characteristics despite significant and repeated bending and deformation of the polymer substrate.

Mechanical integrity (e.g., durability and adhesion) of a coating can be important in practical applications. Three main reasons are proposed for this excellent adhesion and structural integrity. First, due to the extreme scale difference between that of the nanostructure and the bend radius, no significant deformation takes place on the scale of the nanostructure. Second, as described above, a physically intermixed layer of nanoporous material and polymer substrate is measured by both ellipsometry and further verified with transmittance and reflectance calculations and measurements. Optical coating calculations not incorporating an intermixed layer do not find good agreement with the measured experimental data. And third, in addition to physical intermixing, the phenomenon known as cross-linking is also thought to occur between dielectric films and polymer surfaces. That is, rather than simply resting on top of the polymer substrate, chemical bonding takes place between the nanoporous coating and polymer surfaces due to the inherent energies present during electron beam depositions. This chemical bonding and physical intermixing provide a mechanism for the excellent adhesion characteristics between these nanoporous films and polymer substrates. Such high-energy environments leading to excellent adhesion would also be present in other deposition processes, e.g., plasma enhanced deposition.

In other embodiments, the mechanical properties of the coatings can be improved by calcinating the as-assembled multilayers at a high temperature (e.g., 550 degrees Celsius) for 3 hours which leads to the fusing of the nanoparticles together and also better adhesion of the coatings to glass substrates. (see, e.g., U.S. patent application Ser. No. 11/268,574). A similar calcination effect can be achieved at a temperature below 550 degrees Celsius when the calcination is performed in the presence of a suitable calcination reagent. The calcination conditions can be compatible with plastic materials which have low heat distortion temperatures (i.e., below 200 degrees Celsius). Some such plastics include, for example, polyethylene terephthalate (PET), polycarbonate (PC), and polyimides.

Having demonstrated the ability of nanoporous films to be fabricated on polymers and subsequently molded into three-dimensional shapes, optical reflectance coatings (Distributed Bragg Reflectors, DBR) were fabricated on polycarbonate substrates using alternating layers of nanoporous $SiO_2$ and $TiO_2$. These optical coatings were then molded into various three dimensional shapes.

Two categories of molding occurred. In the first, a flat polymer substrate with a DBR coating was heat formed around a rod with a radius curvature of 5 mm. In this molding experiment, no significant change in surface area of the substrate or optical film occurred. In the second category, the optical coatings were heat formed around a 1 inch diameter hemisphere. In this case, stretching took place because of the projection of a two-dimensional surface onto a three-dimensional surface. The results of these experiments can be seen visually in the photograph in FIG. 9.

Visual inspection of such molded nanoporous coatings on polymers showed i) films molded as in the first case, with no stretching, show no signs of structural damage to the optical film. Damage to the DBR structure would manifest itself in color changes of the film, or even more apparent, in scattering or haziness of the optical film.

For films molded as in the second case, with stretching of the substrate, these films show us two important characteristics. First, for optical films with limited stretching, i.e. the film surface limited to the hemispherical region of molding, the films remain specular and maintain their original color. This indicates for molded films with limited stretching (approximately 10%), the nanostructure of the film remains intact. Second, for stretching of over 10%, scattering or haziness become readily apparent on the sides of the molded shape.

It is important to note that even in these areas of greater deformation, the color of the reflected light remains the same. This indicates that macroscopic changes in the film morphology are manifested as scattering sites located in the film, but that the important nanoscale structure governing the color of the reflected light of film remains intact. In nanostructured films of different materials or pretreatment condition, and for applications with less sensitive requirements as optical films, it is plausible that the important physical characteristics of such nanostructured films can be maintained with even greater stretching conditions.

In addition, the inventors conducted experiments to test the nanoporous coatings' ability to withstand shrinking of the substrate. Nanoporous $SiO_2$ coatings were fabricated on Shrink Wrap film. Optical measurements were taken of the coatings. The Shrink Wrap was placed in an oven and allowed to shrink to ~90% of its initial size. Visual inspection of the film indicated that the nanoporous coating remained intact. Optical measurements confirmed that: first, the nanocoating was there, and second, that the properties of the nanocoating had changed only slightly, consistent with expectation. These results combined with the above molding experiment results suggest that nanoporous coatings survive optical and structural size deformations of at least ±10%. In one embodiment, the nanoporous coatings of the presently taught invention survive optical and structural size deformations of at least ±30%. In one embodiment, the nanoporous coatings of the presently taught invention survive optical and structural size deformations of at least ±50%.

The teachings of the present invention apply to a number of applications, including anti-reflective coatings for all kinds of display applications, and coatings with improved wetting characteristics; easy to clean and self-cleaning coatings; easy to clean and self-cleaning anti-reflective coatings; non-stick coatings; low dielectric coatings for semi-conductors; low dissipation (low optical loss) coatings for optical wave guides; controlled release coatings; and hard membranes.

All publications, patents, and patent applications mentioned herein are hereby incorporated by reference in their entirety as if each individual publication or patent was specifically and individually indicated to be incorporated by reference. In case of conflict, the present application, including any definitions herein, will control. While several aspects of the present invention have been described and depicted herein, alternative aspects may be effected by those skilled in the art to accomplish the same objectives. Those skilled in the art will recognize, or be able to ascertain using no more than routine experimentation, many equivalents to the specific embodiments of the invention described herein. Accordingly, it is intended by the appended claims to cover all such alternative aspects as fall within the true spirit and scope of the invention.

What is claimed is:
1. A composite polymer-nanoporous film, comprising:
   a nanoporous coating comprising inorganic particles firmly adhered to a surface of a flexible or moldable transparent polymer substrate comprising polyester;
   said nanoporous coating is a tunable refractive index film on said flexible or moldable polymer substrate and said inorganic particles comprise standing silica nanocolumns arranged in an array on the surface of the polymer substrate; and a transmittance of the composite polymer-nanoporous film over a wavelength range of 400 nm to 1600 nm is altered by less than 1% by a repeated bending of the composite polymer-nanoporous film, wherein the repeated bending comprises bending the composite polymer-nanoporous film around a radius of curvature of 5 mm ten or more times.

2. The composite polymer-nanoporous film of claim 1, wherein said nanoporous coating on the surface of the polymer substrate is from about 10 nm to about 2000 nm thick.

3. The composite polymer-nanoporous film of claim 1, wherein said composite polymer-nanoporous film has a plurality of uniformly or randomly distributed nanopores.

4. The composite polymer-nanoporous film of claim 1, wherein the nanoporous coating comprises metals.

5. The composite polymer-nanoporous film of claim 1, wherein the nanoporous coating comprises nanoparticles of about 100 nm or less in their smallest dimension.

6. A composite polymer-nanoporous film, comprising:
a nanoporous coating comprising inorganic particles firmly adhered to a surface of a flexible or moldable transparent polymer substrate comprising polycarbonate;
said nanoporous coating is a tunable refractive index film on said flexible or moldable polymer substrate and said inorganic particles comprise standing nanocolumns arranged in an array on the surface of the polymer substrate and the nanocolumns comprise silicon oxide, titanium oxide, or a combination of silicon oxide and titanium oxide; and
a reflectance by the composite polymer-nanoporous film over a wavelength range of 400 nm to 800 nm is altered by less than 1% by a repeated bending of the composite polymer-nanoporous film around a radius of curvature of 5 mm ten or more times.

7. The composite polymer-nanoporous film of claim 6, wherein said nanoporous coating on the surface of the polymer substrate is from about 10 nm to about 2000 nm thick.

8. The composite polymer-nanoporous film of claim 6, wherein said composite polymer-nanoporous film has a plurality of uniformly or randomly distributed nanopores.

9. The composite polymer-nanoporous film of claim 6, wherein the nanoporous coating comprises metals.

10. The composite polymer-nanoporous film of claim 6, wherein the nanoporous coating comprises nanoparticles of about 100 nm or less in their smallest dimension.

* * * * *